(12) United States Patent
Lin et al.

(10) Patent No.: US 9,048,408 B2
(45) Date of Patent: Jun. 2, 2015

(54) LIGHT EMITTING DIODE PACKAGE

(71) Applicant: ADVANCED OPTOELECTRONIC TECHNOLOGY, INC., Hsinchu Hsien (TW)

(72) Inventors: Hou-Te Lin, Hsinchu (TW); Pin-Chuan Chen, Hsinchu (TW); Lung-Hsin Chen, Hsinchu (TW)

(73) Assignee: ADVANCED OPTOELECTRONIC TECHNOLOGIES, INC., Hsinchu Hsien (TW)

( * ) Notice: Subject to any disclaimer, the term of this patent is extended or adjusted under 35 U.S.C. 154(b) by 0 days.

(21) Appl. No.: 14/077,219

(22) Filed: Nov. 12, 2013

(65) Prior Publication Data

US 2014/0284639 A1 Sep. 25, 2014

(30) Foreign Application Priority Data

Mar. 21, 2013 (CN) .......................... 2013 1 00911749

(51) Int. Cl.
*H01L 33/62* (2010.01)
*H01L 33/48* (2010.01)

(52) U.S. Cl.
CPC .............. *H01L 33/62* (2013.01); *H01L 33/486* (2013.01); *H01L 2924/0002* (2013.01); *H01L 2224/13* (2013.01); *H01L 2224/48247* (2013.01); *H01L 2224/73265* (2013.01)

(58) Field of Classification Search
CPC ........................................................ H01L 33/62
USPC ............................................................. 257/99
See application file for complete search history.

(56) References Cited

U.S. PATENT DOCUMENTS

2009/0321778 A1* 12/2009 Chen et al. ...................... 257/99
2013/0001633 A1* 1/2013 Imai et al. ........................ 257/99

* cited by examiner

*Primary Examiner* — Colleen A Matthews
*Assistant Examiner* — Christopher Johnson
(74) *Attorney, Agent, or Firm* — Novak Druce Connolly Bove + Quigg LLP

(57) ABSTRACT

A light emitting diode (LED) package includes a substrate, a first electrode and a second electrode embedded in the substrate and spaced from each other, an LED die mounted on a top surface of the substrate and electrically connected to the first and the second electrodes. Both the first and the second electrodes include a top face and a bottom face, with the top face and the bottom face of each of the first and the second electrodes being exposed at the top surface and a bottom surface of the substrate, respectively. The top face of the first electrode defines a first groove corresponding to a positive bonding pad (p-pad) of the LED die. The p-pad is partially inserted into the first groove. An oxidation-resistant metal coating layer is filled between an insertion portion of the p-pad and an inner surface of the first groove.

17 Claims, 4 Drawing Sheets

LIGHT EMITTING DIODE PACKAGE

TECHNICAL FIELD

The present disclosure relates generally to a light emitting diode (LED) package, wherein the LED package has an improved oxidation resistance and a high heat dissipation efficiency.

DESCRIPTION OF RELATED ART

LEDs are solid state light emitting devices formed of semiconductors, which are more stable and reliable than other conventional light sources. Thus, LEDs are being widely used in various fields such as numeral/character displaying elements, signal lights, light sources for lighting and display devices.

A traditional LED package usually includes a substrate, a first electrode formed on the substrate, a second electrode formed on the substrate and spaced from the first electrode, and an LED die mounted on a top surface of the substrate. The LED die is electrically connected to the first and the second electrodes by a flip-chip technology, with a positive bonding pad (p-pad) and a negative bonding pad (n-pad) thereof directly contacting with the first and the second electrodes respectively. In order to prolong a life-span of the LED package, it is common to form an encapsulation layer on the substrate to encapsulate the LED die, whereby the LED die of the LED package is isolated from humid ambient air.

However, the humid air is easily permeable into the inside of the LED package from a substrate-encapsulation layer interface due to a weak bonding force existing between the encapsulation layer and the substrate, especially when the encapsulation layer is made of a material such as silicon resin or epoxy resin, whereby an area of a top surface of the first/second electrode corresponding to p-pad/n-pad is prone to oxidation by the humid air permeating into the inside of the LED package. Therefore, such an LED package is difficult to satisfy the requirements of oxidation resistance. Furthermore, the heat generated by the LED die is difficult to be dissipated, which greatly accelerates the deterioration and degradation of the LED package.

What is needed therefore is a light emitting diode (LED) package which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
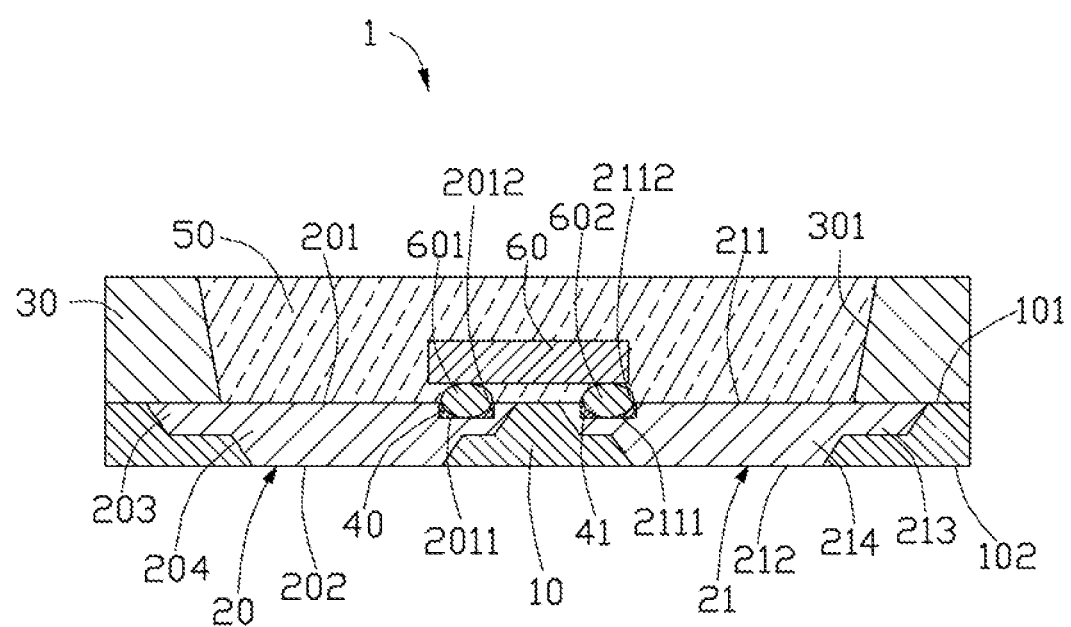
FIG. 1 is a schematic, cross-sectional view of a light emitting diode (LED) package in accordance with a first embodiment of the present disclosure.
Figure 2:
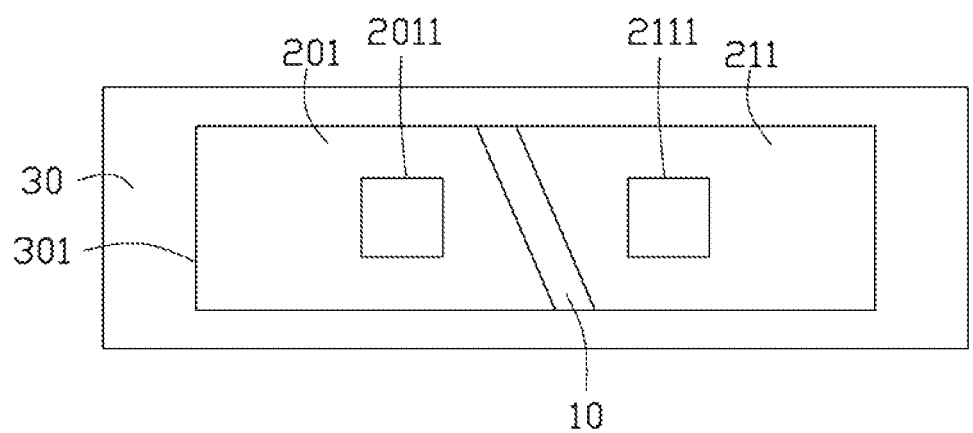
FIG. 2 is a top plan view of the LED package of FIG. 1, with an LED die and an encapsulation layer thereof being omitted for clarity.

Referring to FIGS. 1 and 2, a light emitting diode (LED) package 1 in accordance with a first embodiment of the present disclosure includes a substrate 10, a first electrode 20 embedded in the substrate 10, a second electrode 21 embedded in the substrate 10 and spaced from the first electrode 20, an LED die 60 mounted on the substrate 10, a reflective cup 30 formed on the substrate 10, and an encapsulation layer 50 covering on the substrate 10 and encapsulating the LED die 60. The LED die 60 is reversely disposed, with a positive bonding pad (p-pad) 601 and a negative bonding pad (n-pad) 602 thereof being electrically connected to the first and the second electrodes 20, 21 respectively.

The substrate 10 includes a top surface 101 and a bottom surface 102. In the present embodiment, the substrate 10 is rectangular, and both the top and the bottom surfaces 101, 102 of the substrate 10 are horizontal surfaces which are in parallel with each other. The substrate 10 is a highly heat conductive and electricity insulated substrate which is made of a material such as Si resin or ceramic, whereby the substrate 10 is electrically insulated from the first and the second electrodes 20, 21.

The first and the second electrodes 20, 21 penetrate downward through the substrate 10 from the top surface 101 to the bottom surface 102 of the substrate 10, respectively. The first electrode 20 includes a top face 201 and a bottom face 202 opposite to the top face 201 thereof. The second electrode 21 includes a top face 211 and a bottom face 212 opposite to the top face 211. Both the top faces 201, 211 of the first and second electrodes 20, 21 are exposed at the top surface 101 of the substrate 10. Both the bottom faces 202, 212 of the first and second electrodes 20, 21 are exposed at the bottom surface 102 of the substrate 10.

In the present embodiment, both the top faces 201, 211 of the first and second electrodes 20, 21 are coplanar with the top surface 101 of the substrate 10, and both the bottom faces 202, 212 of the first and second electrodes 20, 21 are coplanar with the bottom surface 102 of the substrate 10. Alternatively, both the top faces 201, 211 of the first and the second electrodes 20, 21 protrude upwardly from the top surface 101 of the substrate 10, and both the bottom faces 202, 212 of the first and the second electrodes 20, 21 protrude downwardly from the bottom surface 102 of the substrate 10.

The first and the second electrodes 20, 21 have a T-shaped transverse cross-section along a thickness direction thereof respectively, whereby an effective contacting area between the first or the second electrode 20, 21 and the substrate 10 is greatly increased. More in details, the first electrode 20 includes a main body 203 and a branch portion 204 integrally extending downwardly from a central region of a bottom face of the main body 203. The main body 203 is trapezoidal in cross section. The branch portion 204 is trapezoidal in cross section. The branch portion 204 has a size smaller than that of the main body 203, and two steps are formed at two lateral joints of the main body 203 and the branch portion 204. Similarly, the second electrode 21 includes a main body 213 and a branch portion 214 integrally extending downwardly from a central region of a bottom face of the main body 213. The main body 213 is trapezoidal in cross section. The branch portion 214 is trapezoidal in cross section. The branch portion 214 has a size smaller than that of the main body 213, and two steps are formed at two lateral joints of the main body 213 and the branch portion 214.

The reflective cup 30 is arranged on the top surface 101 of the substrate 10. The reflective cup 30 defines a receiving cavity 301 therein. The LED die 60 is received in the receiving cavity 301 and surrounded by the reflective cup 30. A lateral outer periphery of the reflective cup 30 is aligned with a lateral periphery of the substrate 10. In the present embodiment, the reflective cup 30 is integrally formed with the substrate 10 as a monolithic piece by injection molding. Alternatively, the reflective cup 30 and the substrate 10 are separately modeled, and then integrated into one monolithic piece. It is preferred that the reflective cup 30 is made of a material such as silicon resin or epoxy resin.

The top face 201 of the first electrode 20 and the top face 211 of the second electrode 21 each are trapezoidal. A majority of the top face 201 is exposed at a bottom of the receiving cavity 301 of the reflective cup 30, with a left-side portion of the top face 201 of the first electrode 20 being covered by the reflective cup 30. Similarly, a majority of the top face 211 is exposed at a bottom of the receiving cavity 301 of the reflective cup 30, with a right-side portion of the top face 211 of the second electrode 21 being covered by the reflective cup 30. That is to say, a short side of the top face 201 of the first electrode 20 away from the second electrode 21 and a short side of the top face 211 of the second electrode 21 away from the first electrode 20 are covered by the reflective cup 30, respectively.

The encapsulation layer 50 is formed in the receiving cavity 301 of the reflective cup 30 and encapsulates the LED die 60 therein. The encapsulation layer 50 completely fills up the receiving cavity 301, i.e., a top of the reflective cup 30 being coplanar with a top surface (not labeled) of the encapsulation layer 50. It is preferred that the encapsulation layer 50 contains phosphor particles distributed therein to scatter and convert a wavelength of light rays emitted from the LED die 60.

The top face 201 of the first electrode 20 defines a first groove 2011 corresponding to the p-pad 601 of the LED die 60, and the top face 211 of the second electrode 21 defines a second groove 2111 corresponding to the n-pad 602 of the LED die 60. The first groove 2011 is located adjacent to a junction of the first electrode 20 and the substrate 10. The first groove 2011 is adjacent to the second electrode 21 but spaced from the substrate 10. The second groove 2111 is located adjacent to a junction of the second electrode 21 and the substrate 10. The second groove 2111 is adjacent to the first electrode 20 but spaced from the substrate 10. In other words, each of the first and the second grooves 2011, 2111 is spaced from the substrate 10 by a short distance.

The p-pad 601 of the LED die 60 is partially inserted into the first groove 2011. The n-pad 602 of the LED die 60 is partially inserted into the second groove 2111. More in details, a depth of the first groove 2011 is smaller than a thickness of the p-pad 601. A depth of the second groove 2111 is smaller than a thickness of the n-pad 602. A top portion of the p-pad 601 protrudes beyond the first groove 2011, and a top portion of the n-pad 602 protrudes beyond the second groove 2111. Alternatively, a depth of the first groove 2011 is equal to a thickness of the p-pad 601, and a depth of the second groove 2111 is equal to a thickness of the n-pad 602. That it to say, the p-pad 601 and the n-pad 602 are completely received in the first and second grooves 2011, 2111, respectively.

In the present embodiment, the p-pad 601 and the n-pad 602 are spherical, while the first and the second grooves 2011, 2111 are cylindrical. The first groove 2011 has an inner surface 2012, and the second groove 2111 has an inner surface 2112. Both the inner surfaces 2012, 2112 of the first and the second grooves 2011, 2111 include a square bottom face and a quadrangular prism-shaped sidewall extending upwardly from an outer periphery of the bottom face. The insertion portion of the p-pad 601 directly contacts with the bottom face and a top end of the sidewall of the first groove 2011. The insertion portion of the n-pad 602 directly contacts with the bottom face and a top end of the sidewall of the second groove 2111.

A first oxidation-resistant metal coating layer 40 made of Au is filled in the gap defined between the insertion portion of the p-pad 601 and the inner surface 2012 of the first groove 2011. A second oxidation-resistant metal coating layer 41 made of Au is filled in the gap defined between the insertion portion of the n-pad 602 and the inner surface 2112 of the second groove 2111.

It is to be understood that a shape of the first and the second grooves 2011, 2111 could be changed according with a shape of the p-pad 601 and the n-pad 602, respectively. For instance, the first and the second grooves 2011, 2111 are semi-spherical, and accordingly, the p-pad 601 is smoothly received in the first groove 2011, with the first oxidation-resistant metal coating layer 40 being sandwiched between the insertion portion of the p-pad 601 and the inner surface 2012 of the first groove 2011. That is to say, an outer peripheral surface of the insertion portion of the p-pad 601 is separated from the inner surface 2012 of the first groove 2011 by the first oxidation-resistant metal coating layer 40. Similarly, the n-pad 602 is smoothly received in the second groove 2111, with the second oxidation-resistant metal coating layer 41 being sandwiched between the insertion portion of the n-pad 602 and the inner surface 2112 of the second groove 2111, which means that an outer peripheral surface of the insertion portion of the n-pad 602 is separated from the inner surface 2112 of the second groove 2111 by the second oxidation-resistant metal coating layer 41.

Figure 3:
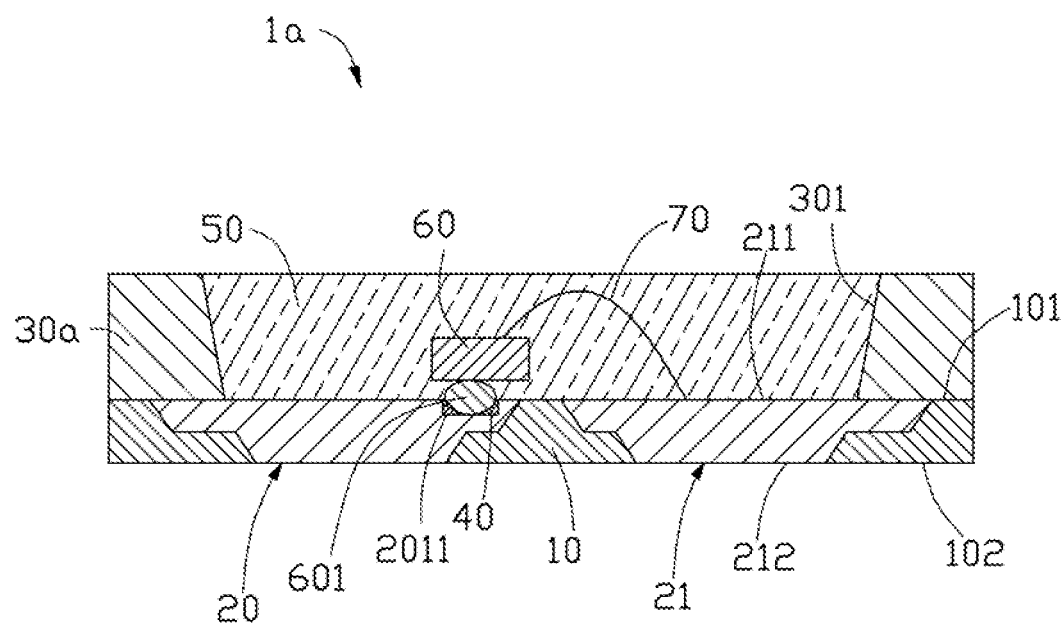
FIG. 3 is a schematic, cross-sectional view of a light emitting diode (LED) package in accordance with a second embodiment of the present disclosure.

Referring to FIG. 3, a light emitting diode (LED) package 1a in accordance with a second embodiment is illustrated. Different from that the p-pad 601 and the n-pad 602 are located at a bottom side of the LED die 60 of the LED package 1 as shown in FIG. 1, the p-pad 601 and the n-pad 602 of the LED die 60 are located at two opposite sides of the LED die 60 of the LED package 1a. More in details, the n-pad (not shown) located at a top side of the LED die 60 is directly electrically connected to the top face 211 of the second electrode 21 via wire 70.

Figure 4:
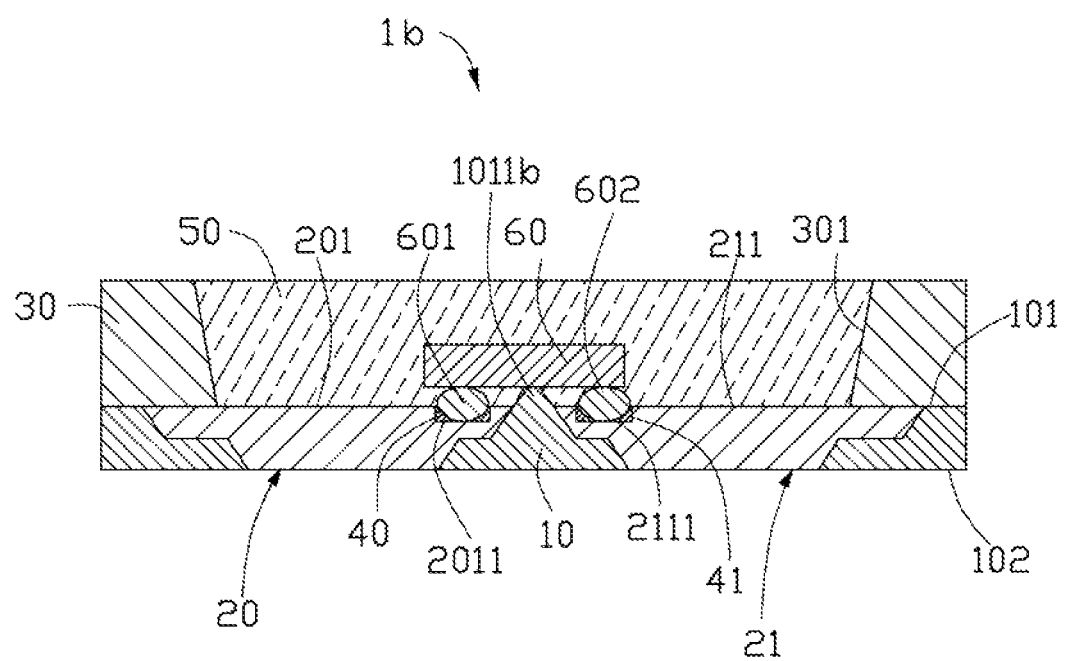
FIG. 4 is a schematic, cross-sectional view of a light emitting diode (LED) package in accordance with a third embodiment of the present disclosure.

Referring to FIG. 4, a light emitting diode (LED) package 1b in accordance with a third embodiment is illustrated. Different from the LED package 1 as shown in FIG. 1, a portion 1011b of the top surface 101 of the substrate 10 located between the first and the second electrodes 20, 21 protrudes from the top faces 201, 211 of the first and second electrodes 20, 21 by a predetermined distance so as to reach a bottom side of the LED die 60. That is to say, the LED die 60 is held at a predetermined height above the first and the second electrodes 20, 21 by the protrusion portion 1011b of the top surface 101 of the substrate 10.

A height of the protrusion portion 1011b of the top surface 101 of the substrate 10 is not less than a difference between a thickness of the p-pad 601 and a depth of the first groove 2011 but smaller than a thickness of the p-pad 601. Similarly, the height of the protrusion portion 1011b of the top surface 101 is not less than a difference between a thickness of the n-pad 602 and a depth of the second groove 2111 but smaller than a thickness of the n-pad 602. That it to say, a gap defined between the insertion portion of the p-pad 601 and the inner surface 2012 of the first groove 2011, together with a gap defined between the insertion portion of the n-pad 602 and the inner surface 2112 of the second groove 2111, could be changed according to the specific height of the protrusion portion 1011b of the top surface 101 of the substrate 10. In the present embodiment, the p-pad 601 and the first oxidation-resistant metal coating layer 40 are joined together by eutectic boding technology. Similarly, the n-pad 602 and the second oxidation-resistant metal coating layer 41 are joined together by eutectic boding technology.

In the present disclosure, the first and the second electrodes 20, 21 have a T-shaped transverse cross-section along a thickness direction thereof respectively, and each of the first and the second grooves 2011, 2111 is spaced from the substrate 10 by a short distance, so a path of the humid air along the junction of the first electrode 20 or the second electrode 21 and the substrate 10 is greatly extended, thereby effectively delaying deterioration rate of the LED package 1 (1a, 1b). What's more, the first oxidation-resistant metal coating layer 40 is filled between the insertion portion of the p-pad 601 and the inner surface 2012 of the first groove 2011, and the second oxidation-resistant metal coating layer 41 is filled between the insertion portion of the n-pad 602 and the inner surface 2112 of the second groove 2111, whereby an area of the top face 201 of the first electrode 20 corresponding to the p-pad 601 is covered by the first oxidation-resistant metal coating layer 40 to prevent the first electrode 20 from air oxidation, and an area of the top face 211 of the second electrode 21 corresponding to the n-pad 602 is covered by the second oxidation-resistant metal coating layer 41 to prevent the second electrode 21 from air oxidation, whereby an oxidation resistance of the LED package 1 (1a, 1b) is greatly improved. Furthermore, the bottom face 202 of the first electrode 20 and the bottom face 212 of the second electrode 21 are exposed at the bottom surface 102 of the substrate 10, through which the heat generated by the LED die 60 is effectively dissipated to the ambient environment. In addition, the p-pad 601 and the n-pad 602 are inserted into the first and the second grooves 2011, 2111, which effectively increasing a contacting area between the p-pad 601 or the n-pad 602 and the first or the second electrode 20, 21, thus the LED package 1 (1a, 1b) having an improved electrical conductivity is obtained.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting diode (LED) package comprising:
a substrate comprising a top surface and a bottom surface;
a first electrode and a second electrode spaced from the first electrode, both the first and the second electrodes being embedded in the substrate, both the first and the second electrodes comprising a top face and a bottom face, the top faces of the first and the second electrodes being exposed at the top surface of the substrate, and the bottom faces of the first and the second electrodes being exposed at the bottom surface of the substrate;
an LED die mounted on the top surface of the substrate and respectively electrically connected to the first and the second electrodes, the LED die comprising a positive bonding pad (p-pad) and a negative bonding pad (n-pad); and
an encapsulation layer covered on the top surface of the substrate to encapsulate the LED die therein;
wherein the top face of the first electrode defines a first groove corresponding to the p-pad of the LED die, and at least a portion of the p-pad is inserted into the first groove, an oxidation-resistant metal coating layer being filled between an insertion portion of the p-pad and at least a portion of an inner surface of the first groove wherein the top face of the second electrode defines a second groove corresponding to the n-pad of the LED die, and at least a portion of the n-pad is inserted into the second groove, an oxidation-resistant metal coating layer being filled between an insertion portion of the n-pad and at least a portion of an inner surface of the second groove; and
wherein a portion of the top surface of the substrate located between the first and the second electrodes protrudes from a plane shared by the top faces of the first and the second electrodes by a predetermined distance to reach a bottom side of the LED die.

2. The LED package of claim 1, wherein the first groove of the first electrode is located adjacent to a junction of the first electrode and the substrate, and the second groove of the second electrode is located adjacent to a junction of the second electrode and the substrate.

3. The LED package of claim 2, wherein the first groove is adjacent to the second electrode but spaced from the substrate, and the second groove is adjacent to the first electrode but spaced from the substrate.

4. The LED package of claim 1, wherein a depth of the first groove is smaller than a thickness of the p-pad, and a top portion of the p-pad protrudes beyond the first groove, a depth of the second groove being smaller than a thickness of the n-pad, a top portion of the n-pad protruding beyond the second groove.

5. The LED package of claim 1, wherein the insertion portion of the p-pad partially contacts with the inner surface of the first groove, and the insertion portion of the n-pad partially contacts with the inner surface of the second groove.

6. The LED package of claim 5, wherein the oxidation-resistant metal coating layer in the first groove is filled in the gap existing between the insertion portion of p-pad and the inner surface of the first groove, and the oxidation-resistant metal coating layer in the second groove is filled in the gap existing between the insertion portion of n-pad and the inner surface of the second groove.

7. The LED package of claim 1, wherein the oxidation-resistant metal coating layer filled in the first groove is sandwiched between the insertion portion of the p-pad and the inner surface of the first groove, and the oxidation-resistant metal coating layer filled in the second groove is sandwiched between the insertion portion of the n-pad and an inner surface of the second groove.

8. The LED package of claim 1, wherein the top faces of the first and the second electrodes are coplanar with the top surface of the substrate.

9. The LED package of claim 8, wherein the bottom faces of the first and the second electrodes are coplanar with the bottom surface of the substrate.

10. The LED package of claim 1, wherein a height of the protrusion portion of the top surface of the substrate is not less than a difference between a thickness of the p-pad and a depth of the first groove but smaller than a thickness of the p-pad, and the height of the protrusion portion of the top surface of the substrate is not less than a difference between a thickness of the n-pad and a depth of the second groove but smaller than a thickness of the n-pad.

11. The LED package of claim 10, further comprising a reflective cup formed on the top surface of the substrate, the reflective cup defining a receiving cavity, and the LED die being received in the receiving cavity and surrounded by the reflective cup.

12. The LED package of claim 11, wherein the top faces of the first and the second electrodes are trapezoidal and a majority of the top face of each of the first and the second electrodes is exposed at a bottom of the receiving cavity, a side portion of the top face of each of the first and the second electrodes being covered by the reflective cup.

13. The LED package of claim 12, wherein the substrate is rectangular, and a lateral outer periphery of the reflective cup is aligned with a lateral periphery of the substrate.

14. The LED package of claim 11, wherein the reflective cup is integrally formed with the substrate as a monolithic piece.

15. The LED package of claim 1, wherein both the first and second electrodes have a T-shaped transverse cross-section along a thickness direction thereof, respectively.

16. The LED package of claim 15, wherein both the first and second electrodes include a main body and a branch portion integrally extending downwardly from a central region of a bottom face of the main body.

17. The LED package of claim 1, wherein the oxidation-resistant metal coating layer is made of gold.

\* \* \* \* \*